US008208592B2

(12) United States Patent
Vilhonen (10) Patent No.: US 8,208,592 B2
(45) Date of Patent: Jun. 26, 2012

(54) RECEIVER

(75) Inventor: Sami Vilhonen, Turku (FI)

(73) Assignee: Nokia Corporation, Espoo (FI)

( * ) Notice: Subject to any disclaimer, the term of this patent is extended or adjusted under 35 U.S.C. 154(b) by 2716 days.

(21) Appl. No.: 10/117,372

(22) Filed: Apr. 5, 2002

(65) Prior Publication Data

US 2003/0053569 A1    Mar. 20, 2003

(30) Foreign Application Priority Data

Apr. 6, 2001    (GB) .................................... 0108726.1

(51) Int. Cl.
  H04L 27/08    (2006.01)
  H04L 25/06    (2006.01)
  H04L 23/00    (2006.01)
  H04B 7/00    (2006.01)
(52) U.S. Cl. ........ 375/354; 375/318; 375/319; 375/377; 455/232.2
(58) Field of Classification Search ............ 455/78, 455/130, 230, 232.1, 232.2, 234, 239.1, 240, 455/323, 324; 375/317, 345, 316, 377, 318, 375/260, 259; 330/250, 259, 262, 270, 278
See application file for complete search history.

(56) References Cited

U.S. PATENT DOCUMENTS

| | | | | |
|---|---|---|---|---|
| 3,714,397 A * | 1/1973 | Macey et al. | ................. | 235/455 |
| 4,225,865 A * | 9/1980 | McPherson | ..................... | 342/92 |
| 4,450,585 A * | 5/1984 | Bell | .............................. | 455/135 |
| 4,731,796 A * | 3/1988 | Masterton et al. | ............ | 375/223 |
| 5,463,662 A * | 10/1995 | Sutterlin et al. | .............. | 375/351 |
| 5,469,115 A * | 11/1995 | Peterzell et al. | ............... | 330/129 |
| 5,617,060 A * | 4/1997 | Wilson et al. | ................ | 330/129 |
| 5,673,293 A | 9/1997 | Scarpa et al. | ................. | 375/321 |
| 5,689,815 A * | 11/1997 | Yamazaki et al. | ............. | 455/69 |
| 5,757,858 A * | 5/1998 | Black et al. | ................... | 375/295 |
| 5,761,251 A * | 6/1998 | Wender | ........................ | 375/345 |
| 5,812,607 A * | 9/1998 | Hutchinson et al. | ......... | 375/322 |
| 6,459,889 B1 * | 10/2002 | Ruelke | .......................... | 455/296 |
| 6,542,558 B1 * | 4/2003 | Schulist et al. | ............... | 375/340 |
| 6,754,288 B2 * | 6/2004 | Gorcea | ........................ | 375/318 |
| 2002/0114384 A1 * | 8/2002 | Nelson et al. | ................. | 375/222 |
| 2002/0172307 A1 * | 11/2002 | Sandberg | ...................... | 375/344 |
| 2003/0193399 A1 * | 10/2003 | Hum et al. | .................. | 340/573.4 |
| 2005/0153664 A1 * | 7/2005 | Moloudi et al. | ................ | 455/78 |
| 2006/0035595 A1 * | 2/2006 | Shi | .................................. | 455/73 |

* cited by examiner

Primary Examiner — Tesfaldet Bocure
(74) Attorney, Agent, or Firm — Ditthavong Mori & Steiner, P.C.

(57) ABSTRACT

A receiver and a method for a receiver is disclosed. The receiver comprises a signal processing path for receiving a first signal modulated by a first modulation method and having a first bandwidth and a second signal modulated by a second modulation method and having a second bandwidth. A common gain control function is provided for processing said first and second signals. A common DC offset cancellation is also provided for said first and second signals. In a preferred embodiment the gain control and the DC offset cancellation a provided by a single circuit.

26 Claims, 5 Drawing Sheets

| Receive a 1st signal modulated by a 1st modulation method and having a 1st bandwidth |
|---|
| Receive a 2nd signal modulated by a 2nd modulation method and having a 2nd bandwidth |
| Process the 1st and the 2nd signals in a common gain control circuit and a common DC offset cancelling circuit |

Fig. 9

RECEIVER

FIELD OF THE INVENTION

The present invention relates to a receiver and more particularly to processing of signals in a receiver.

BACKGROUND OF THE INVENTION

In a typical wireless communication system a receiver part of a receiving station receives radio frequency (RF) signals that have been generated and transmitted by a transmitting station. When a signal is received at the receiving station the radio frequency signal is typically down-converted from the radio frequency to baseband frequency. In a so called direct conversion receiver the radio frequency signal is converted directly to a baseband signal without converting the incoming signal first to one or several intermediate frequencies (IF). Hence the direct conversion receivers are sometimes referred to as zero intermediate frequency receivers.

Figure 1:
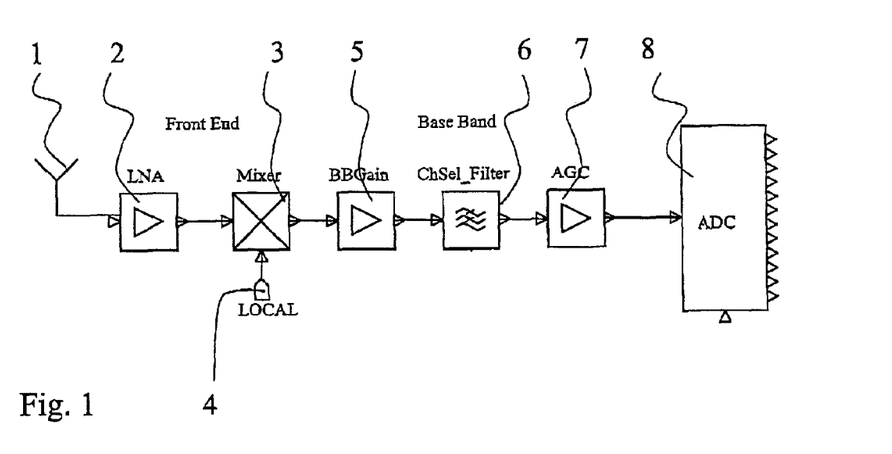
FIG. 1 shows a general block diagram for a signal path in a receiver.

FIG. 1 shows a block chart for a signal path in a receiver. In a typical multi-frequency band and multi-system direct conversion receiver a radio frequency (RF) signal is obtained by antenna means 1. The signal is then typically conducted through band splitter means to split the signal in appropriate frequency bands. In each of the frequency bands the signal may then be conducted through a band filter. The signal in each of the frequency bands may be amplified at the front end of the receiver by appropriate pre-amplifier means. A gain control function 2 (e.g. a low noise amplifier (LNA)) may be used for controlling the level of the gain. If the received signal is substantially strong, the one or more of the amplifiers may be switched to a smaller amplification level at the amplification step.

The amplified RF signal in each of the frequency bands may then be demodulated or mixed to baseband in-phase (I) and quadrature (Q) signals by mixer means 3. In a typical receiver arrangement only one band of the plurality of bands is active at the same time. Said mixer means (e.g. a I/Q demodulator) typically comprise a mixer pair, one for the 0 degree and one for the 90 degree phase shift. The demodulation functions may be accomplished based on a local oscillator signal from block 4.

After the demodulation at block 3 the baseband signal is amplified and possibly low-pass filtered to attenuate further the out-of-channel signals before the signal is input in an active channel filter. The gain is required in order to enable use of substantially high impedance levels in the subsequent channel filter 6 without worsening the noise performance of the receiver.

Automatic gain control (AGC) 7 is carried out after the channel filtering. After the AGC the I and Q signals can be fed to an analog to digital converter (ADC) 8. The signals may be processed at the ADC 8 with digital signal processing means so that e.g. sound can be reproduced based on the received signal.

The baseband parts of an integrated direct conversion receiver consist of the baseband gain, channel filter and automatic gain control functions. These functions require a number of discrete components. These components require a substantially large area on a circuit board. It could be advantageous if the board area could be made smaller, especially in the field of mobile stations. Use of substantially many discrete components should also be avoided in a receiver in order to keep the cost of the receiver circuitry low. As the more complex circuitry designs are more susceptible for failures, mostly because of the increased number of components and joints between the various components, the number of the components should also be kept as low as possible in order to reduce possibilities for faults.

A problem that is faced when implementing a direct conversion receiver is the control of the so called offset voltage. The term "offset voltage" (or direct conversion offset error) refers to an direct conversion error voltage which has become summed up in the receiver into the signal as an essentially direct voltage. The inclusion of the DC off set voltage in the received useful signal should, however, be avoided as it may introduce error in the reproduced sound. The formation of the offset voltage can be caused by many different factors. The skilled person is aware of the phenomena leading to generation of the offset voltage, and this is thus not described in more detail herein.

In direct conversion receivers the variation in the direct current (DC) level causes problems because the DC cannot be amplified with the same gain as the desired signal. Instead a separate gain needs to be used. In the prior art the separate gain for different frequencies has been provided by discrete components. This has increased further the number of the components and the required board area.

Figure 2:
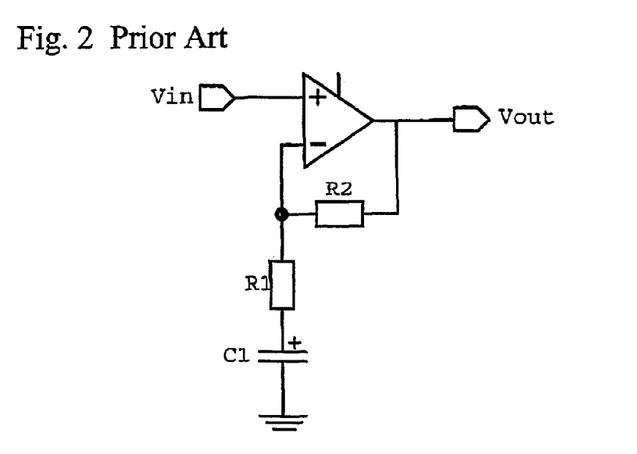
FIG. 2 shows a prior art automatic gain control circuit.
Figure 3:
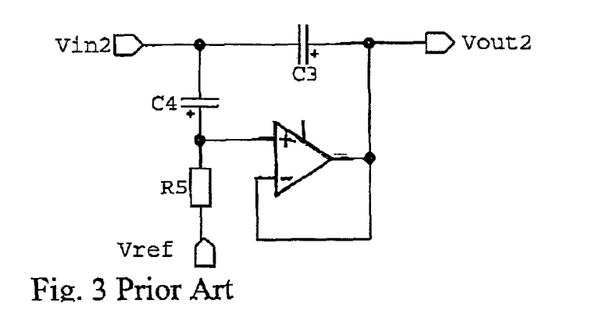
FIG. 3 shows a prior art DC voltage shift circuit.

In addition, in the prior art the error in the DC level is charged in large capacitors (see FIGS. 2 and 3). The capacitors have to be substantially big to ensure that the cut in the frequency is not too high. This is so since the RC product has to be substantially large. The value of the resistance is limited in order not to introduce too much noise. Because of the requirement for substantially large capacitors a fully integrated automatic gain control (AGC) has not been considered as a viable possibility.

In the modern receivers the complexity and size of the radio parts has also increased because a receiving terminal may need to be able to handle an increased number of operation bands and/or modes. A receiver may be adapted to be used in a multisystem or multiband environment and/or may need to be co-operative with more than one serving network or system or standard or frequency and so on. An example of a multiband system is a dual-band GSM mobile stations served by both 900 MHz and 1800 MHz frequencies. An example of a multisystem is a dual mode telephone operating e.g. both in the GSM (Global System for Mobile communications) and in WCDMA UMTS (Wideband Code Division Multiple Access Universal Mobile Telecommunications Service) networks.

In an integrated circuit (IC) for a multimode receiver the number of I/O (input/output) pins is typically limited. This is another reason why use of discrete components should be avoided.

The level of the received signal may vary, the lowest received frequency being 0 Hz. In a direct conversion receiver the DC-level in the baseband may thus also vary. Consequently, there may also be variation in the level of the DC-voltage of the receiver. The DC-voltage variation cannot be amplified since it would cause wrong biasing in the baseband and most likely phenomenon known as clipping in the analog to digital converter (ADC). Some of the lowest frequencies can be removed without compromising the reception performance. For example, it is possible to use a highpass filter for the automatic gain control function in some applications.

However, the maximum highpass frequency required from a highpass filter may be substantially different in systems that are based on different modes. For example, the GSM employs Gaussian-filtered Minimum Shift keying modulation and 200 kHz modulation bandwidth whereas in systems that are based on the WCDMA modulation the modulation bandwidth is typically 5 MHz. Therefore the maximum highpass frequency is substantially smaller in the GSM than what it is in the WCDMA. Discrete highpass filter components may thus be required for different modes.

A simple AGC topology is shown in FIG. 2. In a prior art AGC circuit the DC voltage level of the output Vout of the AGC is determined by the DC voltage level of the input Vin thereof. In other words, the DC gain equals one (1). The output DC voltage of the baseband is determined by the ADC circuit to ensure the performance thereof. Therefore a DC level shift circuit (such as the circuit arrangement of FIG. 3) is used in the prior art. The DC level shift circuit is provided with two external capacitors C3 and C4 for each output Vout.

In the prior art the GSM and WCDMA the automatic gain control (AGC) stages are separated. A specific DC-shift circuit is needed to adjust the DC-level of the automatic gain control (AGC) to a desired level. Since the ACC for the WCDMA part of the receiver cannot be used for the GSM, a separate GSM AGC and another DC-shift circuit is also needed.

SUMMARY OF THE INVENTION

Embodiments of the present invention aim to address one or several of the above problems.

According to one aspect of the present invention, there is provided a receiver comprising a signal processing path for receiving a first signal modulated by a first modulation method and having a first bandwidth and a second signal modulated by a second modulation method and having a second bandwidth. The receiver comprises also a common gain control circuit for said first and second signals and a common DC offset cancelling circuit for said first and second signals.

In a more specific embodiment said common gain control and said common DC offset cancelling stages are provided by a single circuit. The gain control circuit may comprise a first input for the signals and a second input for a reference signal. The gain control circuit may be provided by an inverting amplifier.

The output of the gain control circuit may be controlled in response to a reference signal. The reference signal may comprise a reference voltage supplied by a device that receives signal from the output of the gain control circuit.

The signal processing path may comprise buffering means.

A sensing circuit may be provided, the circuit being connected between an input and output of a operational amplifier of the DC cancelling circuit.

According to another aspect of the present invention there is provided a method in a receiver comprising receiving in a signal processing path of the receiver a first signal modulated by a first modulation method and having a first bandwidth; receiving in said signal processing path a second signal modulated by a second modulation method and having a second bandwidth; and processing said first signal and said second signal by a common gain control function and a common DC offset cancelling function.

The embodiments of the invention may facilitate receiver circuitry design that can be implemented in a lesser silicon area than typical prior art circuits. The embodiments may also enable common gain entity for different frequencies without necessitating use of discrete components for these functions. Thus the embodiments may enable a fully integrated automatic gain control (AGC).

BRIEF DESCRIPTION OF DRAWINGS

For better understanding of the present invention, reference will now be made by way of example to the accompanying drawings in which.

DESCRIPTION OF PREFERRED EMBODIMENTS OF THE INVENTION

Figure 4:
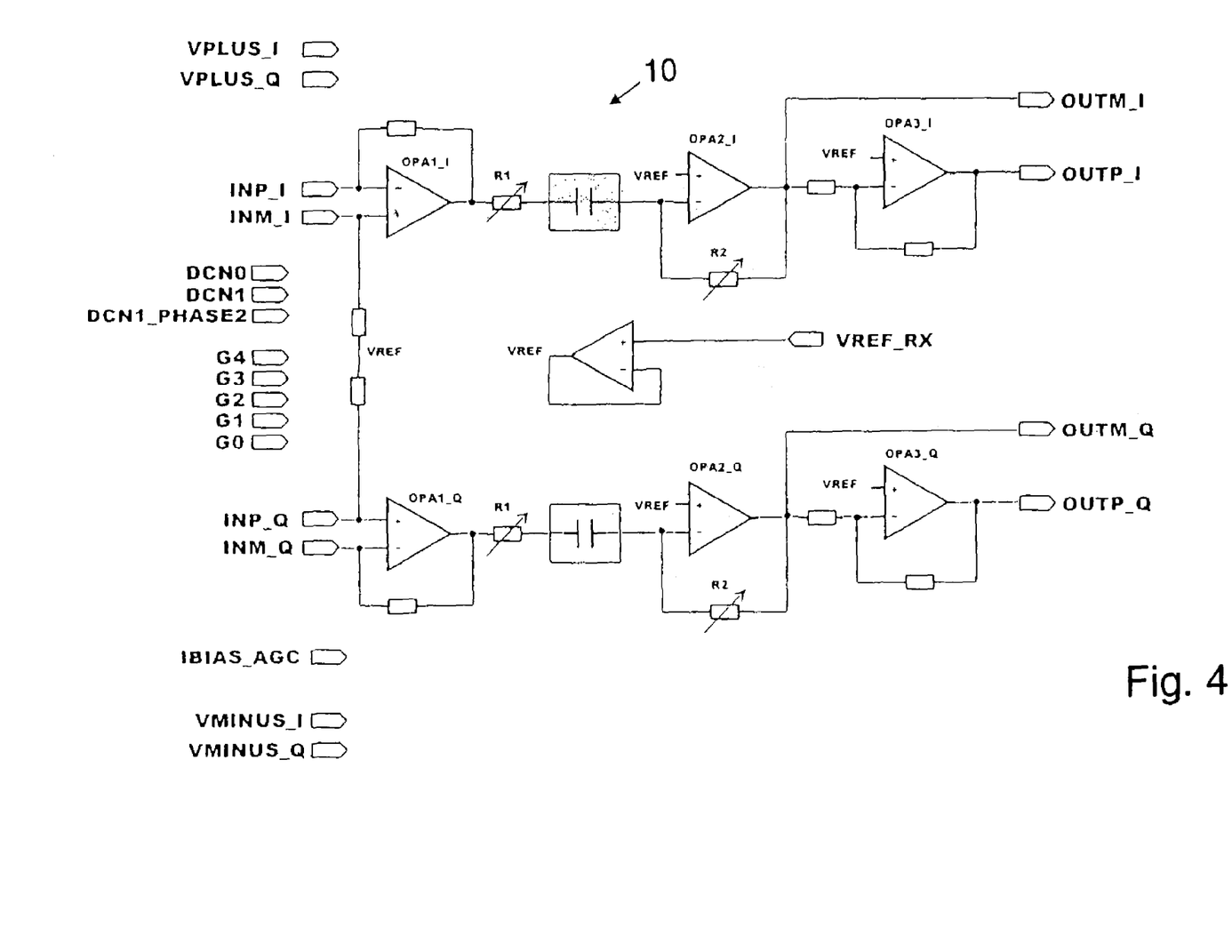
FIG. 4 shows an embodiment of the present invention.

A circuit 10 for a receiver embodying a common multi-mode automatic gain control (AGC) function in accordance with the principles of the present invention is shown in FIG. 4. The circuit is arranged such that the DC level of the output (OUTP_I, OUTP_Q) of the circuit 10 can be fixed regardless of the DC level at the input (INP_I, INP_Q) of the circuit.

Figure 5:
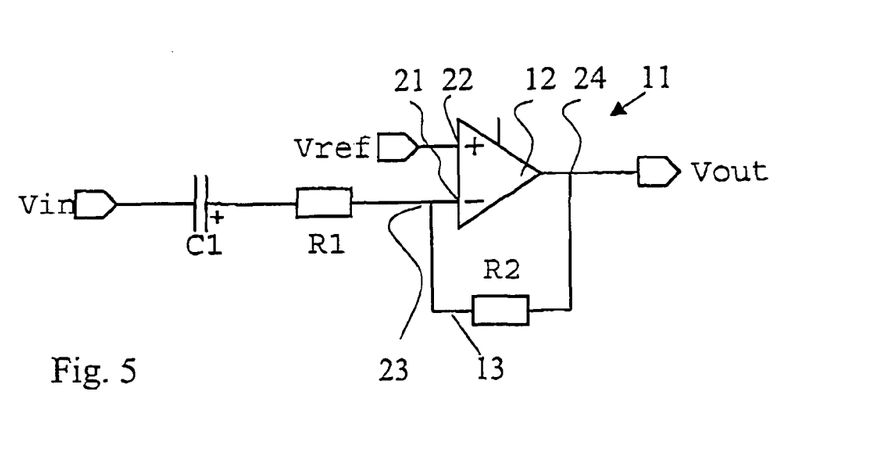
FIG. 5 shows in more detail a part of the FIG. 4 circuit.

FIG. 5 illustrates a circuit 11 that may be used in the FIG. 4 circuit arrangement 10. The circuit 11 comprises a capacitor C1 and a resistor R1 on signal path between the input Vin and an input 21 of an operational amplifier (opamp) 12. Capacitor C1 and the resistor R1 are for defining the high pass filter function of the circuit 11. More particularly, capacitor C1 is for defining the lowpass cut-off frequency of the circuit. Resistors R1 and a second resistor R2 together define the gain of the circuit 11.

The operational amplifier 12 is controlled by a reference signal. The reference signal is fed in another input 22 of the operational amplifier 12. The reference signal preferably comprises a reference voltage Vref. The reference voltage Vref is supplied from the next device on the signal path, that is from the analog to digital converter (ADC) 8 of FIG. 1. The reference signal provides an indication regarding the desired level of the DC voltage that is output from the amplifier 12. The arrangement is preferably such that the output DC level is adjusted to equal with the level of the reference voltage.

A circuit 13 bypassing the operational amplifier 12 is also provided. The circuit 13 is provided with a resistor R2 and is connected on the signal path locations 23 and 24 before and after the operational amplifier 12.

Connection 23 is shown to be located after the resistor R1. However, if the resistor R1 is located before the capacitor C1, the connection 23 could also be located after the capacitor C1. The other end of the circuit 13 is connected on the signal path at the location 24 before the input of an analog to digital converter (ADC).

The circuit arrangement comprising the resistor R1, circuit 13 with the resistor R2 and the operational amplifier 12 provides an inverting amplifier (this may also be referred to as an inverting circuit). The operational amplifier 12 can be used for automatic gain control (AGC). The gain provided by the operational amplifier 12 depends on the relative values of the resistors R1 and R2.

The inverting circuit enables operation wherein the gain i.e. the output DC voltage level at output (Vout) of the circuit 11 can be adjusted. The DC level at the output can be determined regardless of the DC level at the input Vin. That is, the DC gain between the input and output can be zero (0). A high-pass filter and a DC-level shift circuit can therefore be combined into one entity. Only one discrete capacitor component C1 is required for the circuit.

Another benefit provided by the FIG. 5 circuit arrangement is that the circuit requires a smaller input swing region from the operational amplifier (opamp) 12. The gain-bandwidth product may also be lower due to the possibility to attenuate the signal.

The input terminals 21 and 22 of the operational amplifier 12 may stay at a fixed potential. The fixed potential can be seen as a virtual ground. This enables use of a substantially large voltage swing. This in turn may be used to increase the signal-to-noise ratio (S/N) and therefore to improve the performance of the receiver. The fixed potential of the inputs may also make it easier to design a common automatic gain control circuit for different purposes, such as for use in accordance with two different multiplexing techniques.

The inverting amplifier may be used to provide an attenuator function. A substantially high dynamic region may thus be achieved easier and with smaller power by the proposed relatively simple circuitry than by the prior art arrangements The proposed circuitry may thus enable provision of an automatic gain control stage that consumes less power than the prior art arrangements.

In an embodiment the order of the resistor R1 and the capacitor C1 on the signal path is such that the resistor component is located after the capacitor component. As explained below with reference to FIG. 6, this enables sample/hold type functioning of the circuitry. The sample/hold function refers to operation where the output DC level is adjusted onto a desired level and then held on said level.

Figure 6:
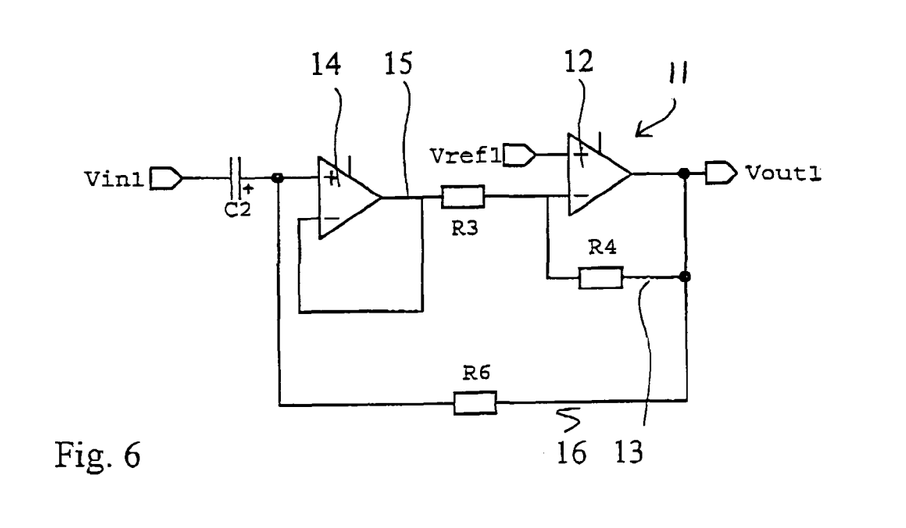
FIG. 6 shows an alternative for the FIG. 5 circuit.

In the FIG. 6 embodiment the automatic gain control circuit arrangement comprises at least two operational amplifiers. The circuit 11 is provided with two subcircuits 13 and 16. Each of the subcircuits provides a return connection to a stage before one or more of the gain control stages. The circuit 13 is provided with resistor R4 and corresponds in operation to the circuit 13 of FIG. 5.

More particularly, circuit 11 is shown to comprise a first operational amplifier 14 and a second operational amplifier 12 between a capacitor C2 and an output Vout1. The reference voltage signal Vref is provided by an analog to digital converter and is input in the second operational amplifier 12. The second amplifier 12 and resistors R3 and R4 form an inverting amplifier that corresponds the inverting amplifier arrangement of FIG. 5. The resistor R3 provided on the connection 15 between the first and second operational amplifiers and the resistor R4 of circuit 13 determine the gain of the automatic gain control i.e. the gain of the second operational amplifier 12.

The circuit 16 is connected to bypass the first and the second operational amplifiers 12 and 14. The circuit 16 is provided with resistor R6. In operation, DC error at the output of the second operational amplifier 12 is loaded through the circuit to the capacitor C2 as long as a desired output voltage level is achieved. The circuit 16 may then be switched "off" so as to hold said output level. For example, the circuit 16 may be switched "off" when receiving a GSM signal and be in an "on" state when receiving e.g. a WCDMA signal.

It shall be understood that the circuit 11 operates in accordance with the principles of the invention also if the resistor R1 is located before the capacitor C1.

The first operational amplifier 14 of FIG. 6 is not for the provision of any gain. Instead, it may be used for buffering the potential so that the capacitor C2 cannot leak via connection 15 to the second amplifier 12.

The inclusion of an extra operational amplifier 14 for buffering the voltage makes it possible to reduce the size of the capacitor C2 and to provide the sample/hold level shift function. This enables operation where the automatic gain control stays in a substantially similar condition over an entire burst. The level may be upheld even if the DC-level condition is slightly incorrect. This type of function may be needed in reception arrangements that are substantially sensitive for errors in the received bits.

Figure 7:
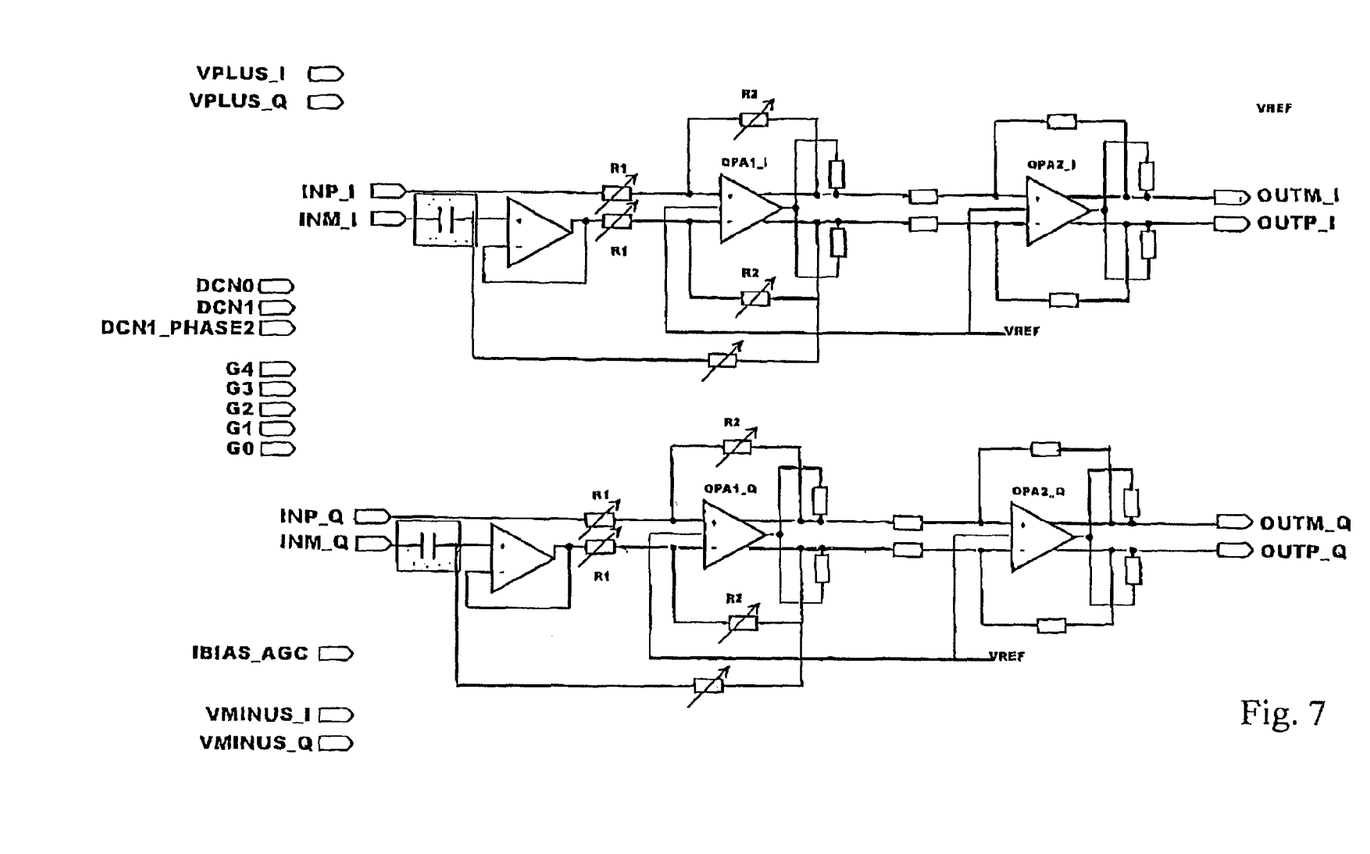
FIG. 7 shows an alternative for the FIG. 4 circuit.

A multimode automatic gain control (AGC) function can also be implemented with differential topology. A possibility for this is shown by FIG. 7.

The above discusses a single-ended automatic gain control (AGC). It shall be appreciated that the same principles can be applied to a differential automatic gain control (AGC). This, however, may consume somewhat more power and silicon area than the single ended application. Despite this the inventor believes this as justified if the frequencies are high, as is the case e.g. with the WCDMA. In single-mode receivers such as the GSM devices the single-ended topology is believed to be more appropriate.

Figure 8:
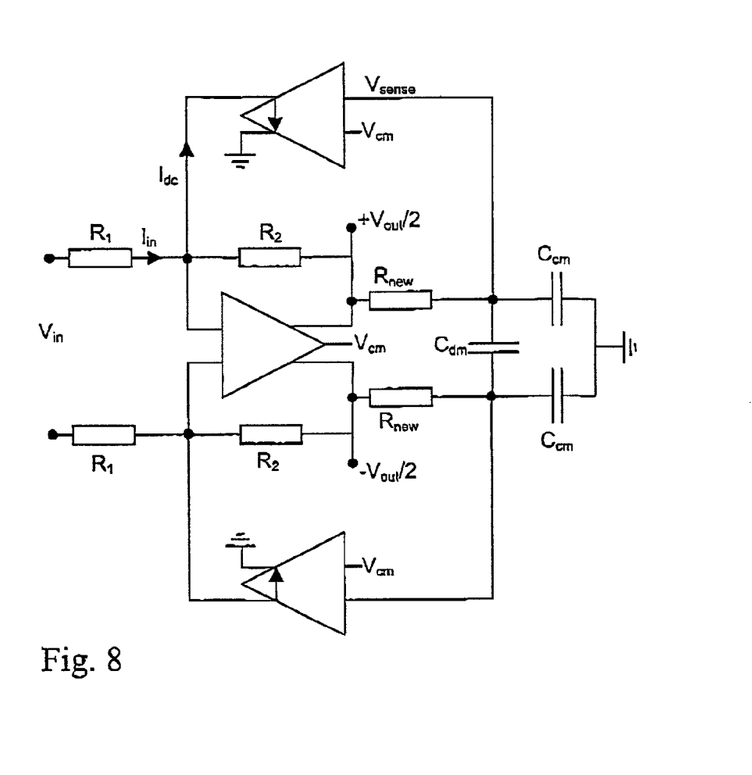
FIG. 8 shows a further embodiment of the invention.
Figure 9:
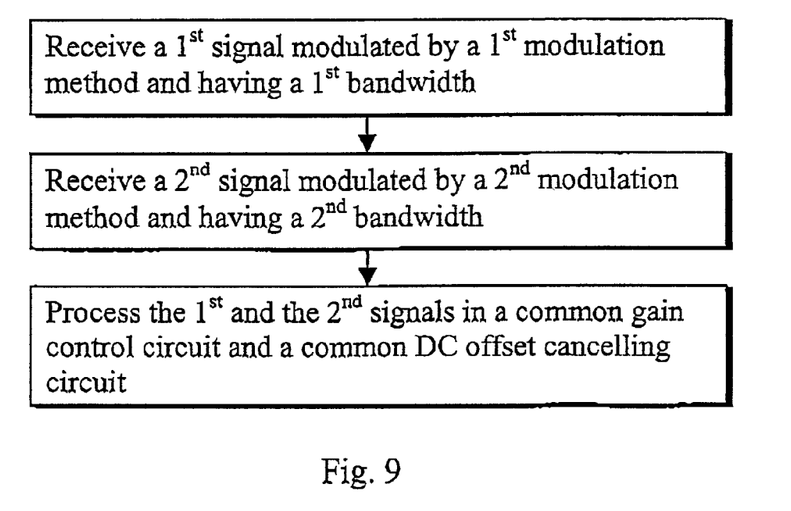
FIG. 9 is a flowchart illustrating the operation of one embodiment of the present invention.

FIG. 8 shows an embodiment wherein separate AGC and DC-cancellation circuits are provided. In this embodiment the DC level of the receiver can be changed by drawing DC-current from the input vin of the circuit. The DC-current drawn from the input is preferably proportional to the DC offset of the circuit. The relation may be defined by:

$$I_{dc}=(V_{cm}-V_{sense})/R_1$$

It shall be appreciated that the DC-compensation can also be made in an earlier stage on the signal path of the circuit. For example, the DC-cancellation current can be drawn from the input of the channel select filter 6 of FIG. 1.

In a single-ended topology the DC gain of the automatic gain control (AGC) shall be zero. That is, the DC level of the output does not depend on the DC-level of the input. By means of this it is possible to avoid a need for a DC level shifting circuit.

In a differential topology the situation is different in that the signal can be separated for both common mode and differential mode signals. The common mode DC level is substantially easy to adjust regardless of the input common mode DC level. This is so since the common mode signal does not carry any information. Thus the DC gain for differential signal can differ from zero in a differential AGC without compromising the performance of the analog to digital converter (ADC). The biasing of the automatic gain control (AGC) differential signal can be guaranteed with the common mode DC level.

In the topology of FIG. 8 the DC-voltage at the output Vout is sensed through a RC lowpass filter arrangement. The lowpass filter arrangement is shown to be provided by resistors Rnew and capacitors Ccm and Cdm. The lowpass filtering may be provided with a simplified circuit including only one resistor and one capacitor, e.g. by means of one resistor Rnew and one capacitor Ccm.

The filter function has preferably a very low cut-off frequency. Subtraction of an appropriate signal from the input Vin may then be based on the difference between the output voltage and the desired DC voltage level. The difference refers to the so called error voltage.

In the differential baseband it is in most instances difficult to subtract two voltages from each other. However, it is substantially easy to subtract two currents from each other in the input of an inverting amplifier and therefore is can be advantageously employed in the circuitry of FIG. 8. It is advantageous thus to convert the error voltage into current and then feed this current back to the input of the automatic gain control (AGC) 7 or to the input of the channel select filter 6 of FIG. 1.

As mentioned above, large capacitors are required in the prior art to achieve a low enough cut-off frequency. By means of the circuitry of FIG. 8 it is possible to increase the size of the resistor Rnew without compromising the noise performance of the receiver. This is so since the resistor that may cause a RC product is no longer located on the signal path. Instead of this the resistor component can be located on the sensing circuit comprising the resistor Rnew. This enables provision of an integrated baseband part for a multi-mode direct conversion receiver. Since the resistance that may cause a RC product is no longer located on the signal path the resistance can be increased without compromising the noise performance of the receiver. The noise performance may even be improved.

The circuit may also be provided with a capacitor that is substantially smaller than what is required in the prior art. The capacitor may also be integrated with the automatic gain control (AGC) function. The new topology may be made fully differential which may improve the robustness of the circuit.

The proposed AGC requires much less silicon area than e.g. the prior art WCDMA AGCs. Therefore the costs should also be lower. By combining the AGCs of e.g. the WCDMA and GSM into one entity a substantial reduction in silicon area can be attained especially in multimode receivers. The embodiments may also provide a circuit with a lower current consumption. This increases the time that can be used for communication e.g. by a mobile station. The amount of discrete components required is also much lower than in the previous solutions, which lowers the cost and size of the mobile station.

It should be appreciated that whilst embodiments of the present invention have been described in relation to mobile stations, embodiments of the present invention are applicable to any other suitable type of user equipment and stations. For example, the embodiments may be employed by a base station of a wireless communication system.

The embodiment of the present invention has been described in the context of GSM and WCDMA systems. This invention is also applicable to any other wireless communication techniques.

It is also noted herein that while the above describes exemplifying embodiments of the invention, there are several variations and modifications which may be made to the disclosed solution without departing from the scope of the present invention as defined in the appended claims.

The invention claimed is:

1. An apparatus comprising:
   a signal processing path for receiving a first signal modulated by a first modulation method and having a first bandwidth and a second signal modulated by a second modulation method and having a second bandwidth;
   a single circuit for providing both DC offset control and gain control for said first and second signals;
   wherein the single circuit comprises a first input for the signals and a second input for a reference signal and the output of the common gain control circuit is controlled in response to the reference signal.

2. An apparatus as claimed in claim 1, wherein the single circuit is provided by an inverting amplifier.

3. An apparatus as claimed in claim 2, wherein said inverting amplifier comprises: an operational amplifier; a circuit connected on the signal path at a first location before the operational amplifier and a second location after the operational amplifier, said circuit being provided with a resistor; and a further resistor on the signal path at a location before said first location.

4. An apparatus as claimed in claim 1, wherein the reference signal comprises a reference voltage supplied by a device that receives the signal from the output of the single circuit.

5. An apparatus as claimed in claim 4, wherein the output voltage of the single circuit is adjusted to equal the reference voltage.

6. An apparatus as claimed in claim 1, wherein the signal processing path comprises buffering means.

7. An apparatus as claimed in claim 6, wherein the signal processing path is adapted for a sample/hold type operation.

8. An apparatus as claimed in claim 6, comprising a further circuit for provision of a connection between the output of the single circuit and input of the buffering means.

9. An apparatus as claimed in claim 8, wherein the further circuit is adapted for switching between on and off states.

10. An apparatus as claimed in claim 1, comprising a sensing circuit connected between an input and output of an operational amplifier of the single circuit.

11. An apparatus as claimed in claim 10, wherein the sensing circuit comprises a RC lowpass filter.

12. An apparatus as claimed in claim 1, wherein the modulation of the first signal is based on wideband code division multiple access.

13. An apparatus as claimed in claim 1, wherein the first signal comprises a signal from a transmitter of a third generation communication system.

14. An apparatus as claimed in claim 13, wherein the communication system is based on a universal mobile telecommunications service (UMTS) standard.

15. An apparatus as claimed in claim 1, wherein the modulation of the second signal is based on Gaussian-filtered Minimum Shift Keying.

16. An apparatus as claimed in claim 1, wherein the second signal comprises a signal from a transmitter of a GSM communication system.

17. A method in a receiver comprising:
   receiving in a signal processing path of the receiver a first signal modulated by a first modulation method and having a first bandwidth;
   receiving in said signal processing path a second signal modulated by a second modulation method and having a second bandwidth;
   processing said first signal and said second signal in a single circuit providing common gain control function and a common DC offset cancelling function;
   inputting a reference signal into the common gain control function; and
   controlling the output of the common gain control function in response to the reference signal.

18. A method as claimed in claim 17, wherein the single circuit comprises an operational amplifier provided with a first and a second input that are kept in a fixed potential.

19. A method as claimed in claim 17, wherein the DC level of the output of the signal processing path is adjusted based on the reference signal.

20. A method as claimed in claim 17, wherein the reference signal comprises a current drawn from a stage that precedes the common DC offset cancelling function.

21. A receiver comprising:
   a signal processing path for receiving a first signal modulated by a first modulation method and having a first bandwidth and a second signal modulated by a second modulation method and having a second bandwidth; and
   a single circuit for providing a common gain control circuit for said first and second signals and a common DC offset cancelling circuit for said first and second signals, wherein the gain control circuit comprises an operational amplifier provided with a first input for the signals and a second input for a reference signal, a subcircuit connected on the signal path at a first location before the operational amplifier and a second location after the operational amplifier, said subcircuit being provided with a resistor, and a further resistor on the signal path at a location before said first location.

22. A method in a receiver comprising:

receiving in a signal processing path of the receiver a first signal modulated by a first modulation method and having a first bandwidth;

receiving in said signal processing path a second signal modulated by a second modulation method and having a second bandwidth;

processing said first signal and said second signal in a single circuit providing a common gain control function and a common DC offset cancelling function, wherein the gain control function of the single circuit comprises an operational amplifier provided with a first and a second input and the first and second signals are received in the first input of the gain control function;

receiving a reference signal in the second input of the common gain control function; and maintaining the first input and the second input in a fixed potential by means of a subcircuit, the subcircuit being connected on the signal path at a first location before the operational amplifier and a second location after the operational amplifier and comprising a resistor, and a further resistor on the signal path at a location before said first location.

23. An apparatus comprising:

a signal processing path configured to receive a first signal modulated by a first modulation scheme and a second signal modulated by a second modulation second, wherein the first signal and the second signal are received over a radio communication system; and a single circuit for providing DC offset control and gain control for the first signal and the second signal, wherein the single circuit includes a first input for the signals and a second input for a reference signal, and the output of the single circuit is controlled in response to the reference signal.

24. An apparatus as claimed in claim 23, wherein the single circuit is configured to fix a DC level at the output regardless of the DC level at the input.

25. A method comprising:

receiving a first signal modulated by a first modulation scheme and a second signal modulated by a second modulation second, wherein the first signal and the second signal are received over a radio communication system; and providing DC offset control and gain control, using a single circuit, for the first signal and the second signal, wherein the single circuit includes a first input for the signals and a second input for a reference signal, and the output of the single circuit is controlled in response to the reference signal.

26. A method as claimed in claim 25, wherein the single circuit is configured to fix a DC level at the output regardless of the DC level at the input.

* * * * *